United States Patent [19]
Wilber et al.

[11] Patent Number: 5,608,282
[45] Date of Patent: Mar. 4, 1997

[54] PIEZOELECTRICALLY CONTROLLED SUPERCONDUCTING SWITCH

[75] Inventors: William D. Wilber, Neptune; Ernest Potenziani, II, Ocean; Steven C. Tidrow, Eatontown; Arthur Tauber, Elberon; Donald W. Eckart, Wall, all of N.J.

[73] Assignee: The United States of America as represented by the Secretary of the Army, Washington, D.C.

[21] Appl. No.: 425,947

[22] Filed: Apr. 19, 1995

[51] Int. Cl.⁶ .................................. H01L 41/08
[52] U.S. Cl. .................. 505/211; 310/317; 310/328; 310/311; 327/371
[58] Field of Search ................... 310/311, 328, 310/330, 317

[56] References Cited

U.S. PATENT DOCUMENTS 3,050,643  8/1962  Connell et al. ............... 307/88.5
3,722,288  3/1973  Weber ............................ 73/382
5,030,617  7/1991  Legge ............................ 505/1

OTHER PUBLICATIONS

C. L. Larkins, M. Y. Avello, J. B. Boyce, D. K. Fork, "Multilayer Ferroelectric–High TC Structures with Poled Ferroelectric Layers", Super Conductivity Conference, Oct. 17–21, 1994.

*Primary Examiner*—Mark O. Budd
*Attorney, Agent, or Firm*—Michael Zelenka; William H. Anderson

[57] ABSTRACT

A piezoelectrically controlled superconducting switch is provided for use in superconducting devices and piezoelectric devices. This switch includes a substrate, a superconductor which is bonded to the substrate, and a piezoelectric subassembly which has a load applicator and voltage source for straining the superconductor and for changing its superconductor curve of resistivity versus temperature.

5 Claims, 2 Drawing Sheets

PIEZOELECTRICALLY CONTROLLED SUPERCONDUCTING SWITCH

GOVERNMENT INTEREST

The invention described herein may be manufactured, used and licensed by or for the Government for governmental purposes without the payment of any royalties thereon.

FIELD OF THE INVENTION

The invention described herein generally relates to a superconducting switch, and in particular the invention relates to a superconducting switch which has a piezoelectric control.

BACKGROUND OF THE INVENTION

A preprint of a technical paper, which was received at the Applied Superconductivity Conference on Oct. 17–21, 1994, and which is entitled "Multilayer Ferroelectric—High $T_C$ Structures with Poled Ferroelectric Layers", and which is authored by Grover L. Larkins, Jr., Miriam Y. Avello, James B. Boyce and David K. Fork, contains related equipment test information.

One type of prior art superconducting switch has a temperature control. A second type of prior art superconducting switch has a magnetic control. In both types of switches, the change in resistivity between a 'normal' state and a 'superconducting' state provides the switching action. A change in resistivity can be caused by increasing the temperature to above the transition temperature or by applying a magnetic field that is greater than the critical magnetic field.

One problem with each of the prior art switches is that each switch requires a relatively large level of current for operation thereof. A second problem with each of the prior art switches is that each switch requires a relatively long startup time.

SUMMARY OF THE INVENTION

According to the present invention, a piezo electrically controlled superconducting switch is provided. This switch comprises a substrate, a superconductor which is bonded to the substrate, and a piezoelectric subassembly for straining between a normal unstrained condition and an induced strained condition of a portion of the superconductor, said piezoelectric subassembly having a load-applying means for causing a strain in the superconductor portion.

By using the piezoelectric subassembly, the superconductor at a selected portion can be strained, so that its curve of resistivity versus temperature shifts, and so that the superconductor portion has a low resistivity in an unstrained condition and has a high resistivity in a strained condition, whereby the superconductor portion acts as a switch in the superconductor line.

One object of the present invention is to provide a non-thermal, non-magnetic, piezoelectrically controlled superconducting switch.

Another object is to provide a relatively fast-acting superconducting switch.

BRIEF DESCRIPTION OF THE DRAWINGS

The foregoing and other objects, features and advantages will be apparent from the following description of the preferred embodiments of the invention as illustrated in the accompanying drawings.

DESCRIPTION OF THE PREFERRED EMBODIMENTS

Figure 1:
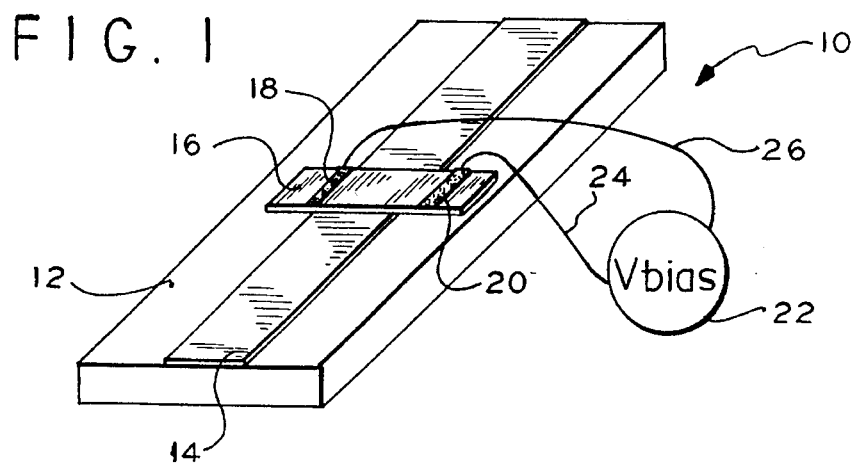
FIG. 1 is a perspective view of a first embodiment of a piezoelectrically controlled superconducting switch according to the invention.

As shown in FIG. 1 a first embodiment or device or switch 10 is provided. Device 10 has a substrate 12, and has a superconductor 14, which is bonded to substrate 12. Device 10 also has a transverse piezoelectric film or plate 16, which is bonded to superconductor 14. Plate 16 has a first metal contact 18 which is bonded at one end thereof, and has a second metal contact 20 which is bonded thereto at an opposite end thereof. Device 10 also has a bias voltage applicator or source 22. Source 22 has a first lead 24 which is connected to second contact 20, and has a second lead 26 which is connected to first contact 18. Parts 16, 18, 20, 22, 24, 26 together form a piezoelectric subassembly. Plate 16 is a load applying means which applies load to a portion of superconductor 14 and which is bonded thereto.

Figure 2:
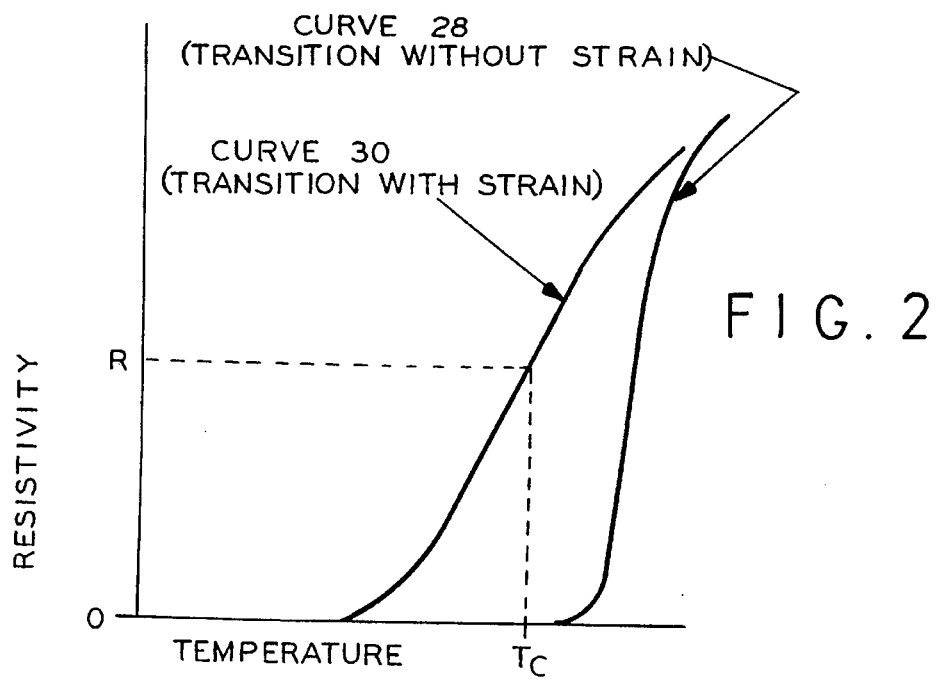
FIG. 2 is a graph of a resistivity versus temperature, which has a first curve of transition without strain and a second curve of transition with strain, of the switch of FIG. 1.

As shown in FIG. 2, a graph of resistivity versus temperature of superconductor 14 is provided, which has a first curve 28 and has a second curve 30. First curve 28 is for a transition without strain. Second curve 30 is for a transition with strain. Piezoelectric plate 16 applies the strain to superconductor 14. Second curve 30 has a point of critical temperature ($T_C$), which has a corresponding resistivity value (R). Induced strain in superconductor 14 increases the transition width, as shown by curve 30, so that, at the critical temperature ($T_C$), there is no resistance in the unstrained state or condition, but there is a resistance (R) for the same temperature in the strained state.

Figure 3:
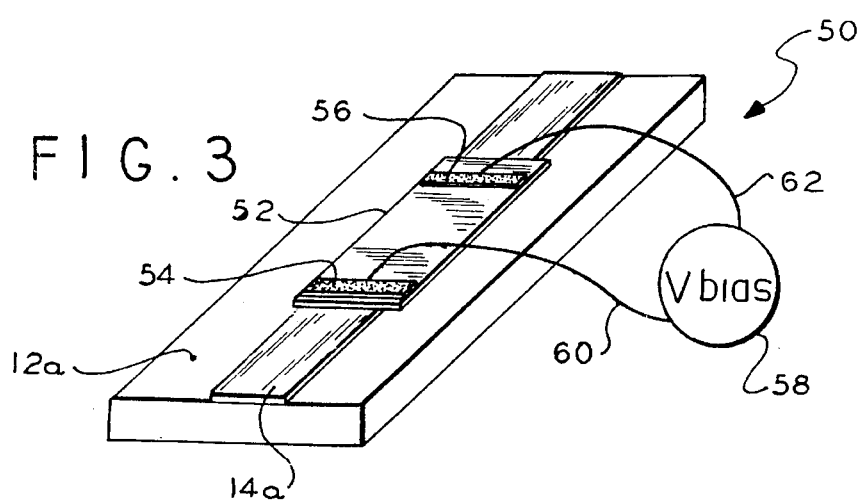
FIG. 3 is a perspective view of a second embodiment of the switch according to the invention.

As shown in FIG. 3, a second embodiment or device 50 is provided. Parts of the second embodiment 50 which are the same as corresponding parts of the first embodiment 10, have the same numerals, but with a subscript "a" added thereto. Device 50 has a substrate 12a, and has a superconductor 14a which is bonded to substrate 12a. Device 50 also has a longitudinal piezoelectric film or plate 52. Plate 52 has a first metal contact 54 and has a second metal contact 56. Contacts 54, 56 are connected to plate 52. Device 50 also has a bias voltage source 58. Source 58 has a first lead 60 which is connected to first contact 54, and has a second lead 62 which is connected to second contact 56. In FIG. 3, the longitudinal plate 52 applies an actuating load on superconductor 14a which is at a direction that is different from that of transverse plate 16 of FIG. 1. Plate 52 applies load to superconductor 14a to cause the strain therein.

Figure 4:
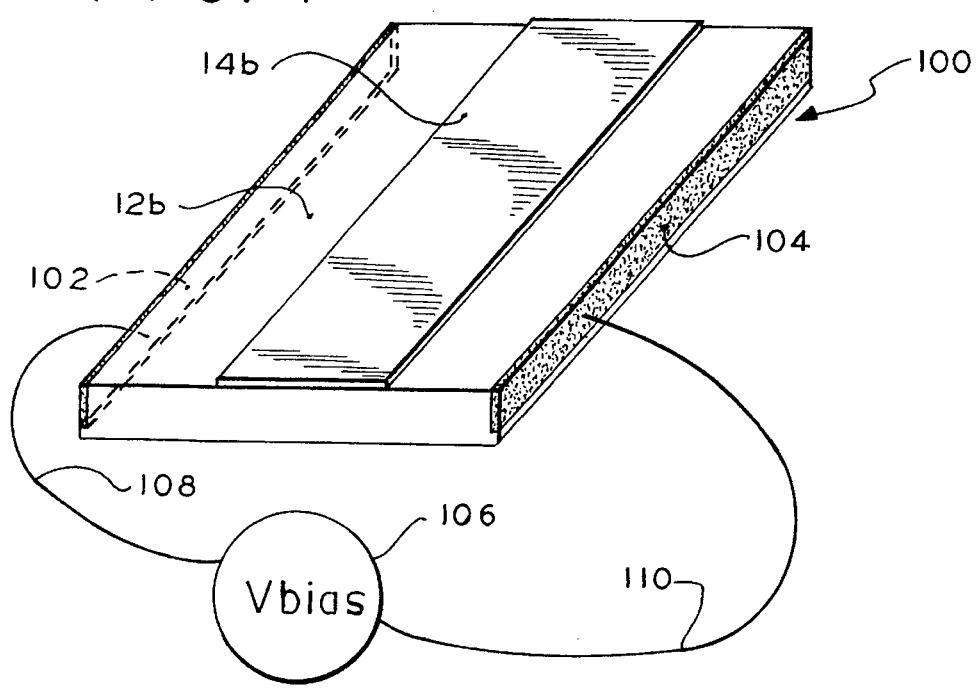
FIG. 4 is a perspective view of a third embodiment of the switch according to the invention.

As shown in FIG. 4, a third embodiment or device 100 is provided. Parts of third embodiment 100, which are the same as corresponding parts of first embodiment 10, have the same numerals but with a subscript "b" added thereto.

Device 100 has a substrate 12b, and has a superconductor 14b which is bonded to substrate 12b. Substrate 12b has the same material as a conventional piezoelectric plate. Substrate 12b has a first metal contact 102 which is connected to one side thereof, and has a second metal contact 104 which is connected to an opposite side thereof. Device 100 also has a bias voltage source 106. Source 106 has a first lead 108 which is connected to first contact 102, and has a second lead 110 which is connected to second contact 104. In device 100, substrate 12b serves also as the piezoelectric element that strains the superconductor 14b. Substrate 12b applies load to superconductor 14b to cause the strain therein.

Figure 5:
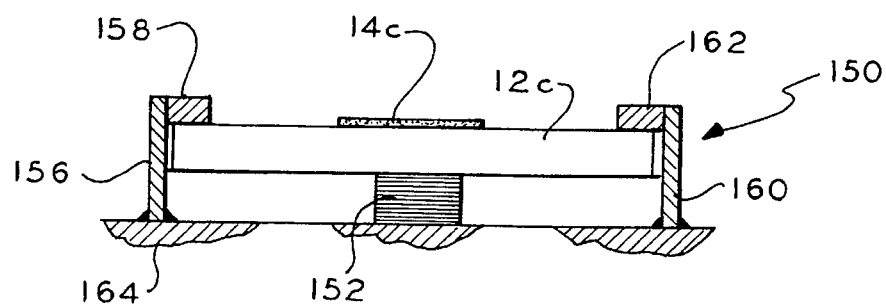
FIG. 5 is a section view of a fourth embodiment of the switch according to the invention, in an unstrained condition.
Figure 6:
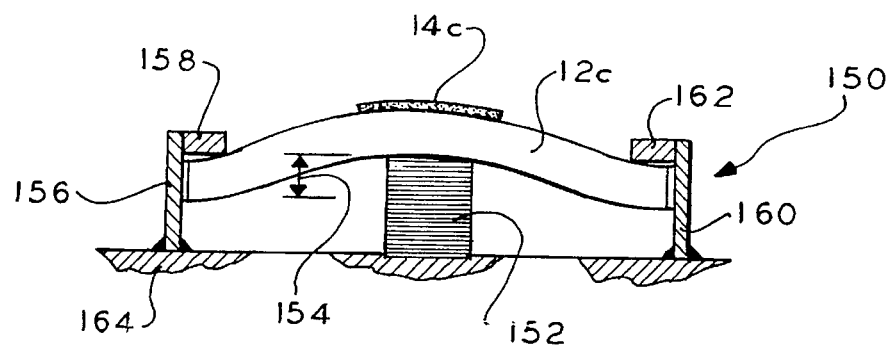
FIG. 6 is a section view of the fourth embodiment of FIG. 5, in a strained condition.

As shown in FIGS. 5 and 6, a fourth embodiment or device 150 is provided. Parts of fourth embodiment 150 which are like corresponding parts of first embodiment 10 have the same numerals, but with a subscript "c" added thereto. Device 150 has a substrate 12c, and has a superconductor 14c, which is bonded thereto. Device 150 also has a piezoelectric transducer 152. In FIG. 5, superconductor 14c is shown in a normal or unstrained state or condition. In FIG. 6, superconductor 14c is shown in a strained state or condition. Wherein transducer 152 has moved superconductor 14c and substrate 12c through a displacement or distance 154. Device 150 also has a left support 156 with a flange 158, and has a right support 160 with a flange 162, and has a base plate 164 which is fixedly attached to supports 156, 160. In embodiment 150, the transducer 152 is used to flex the substrate 12c thereby creating a strain in the superconductor 14c. Transducer 152 applies load to superconductor 14c through substrate 12c.

The basis for switch 10 (and 50, 100, 150) described here is neither magnetic nor thermal, but is rather the influence of strain (that is, the distortion due to an applied force or stress) on the transition characteristics of the superconductor 14. In order to understand this strain effect better, some background information is needed. It is well known that superconducting films (and, in general, crystalline films) grow best when deposited onto substrates that are lattice matched to the superconductor; 'lattice match' meaning that the crystal structure and atomic spacing of the substrate are as similar as possible to that of the superconductor. Lanthanum aluminate is a common substrate used for growing superconducting films of $YBa_2Cu_3O_7$ (or YBCO); there is a very close lattice match and very high quality films can be grown with transition widths less than 1 degree wide. Magnesium oxide is another common substrate, but because it is not quite as well lattice matched, YBCO films on magnesium oxide typically have transition widths that are 2–3 degrees wide. The difference in film quality when poorly lattice matched substrates are used is due, in part, to the stress created when the atoms in the film must accommodate the dimensions of the substrate that are different than the dimensions of the film material. The stress can be partially relieved when an appropriate dielectric layer is deposited on top of the superconducting film.

Using the stress-transition width relationship as a basis, the device 10 is proposed as a superconducting switch. A superconducting film is deposited on a lattice matched substrate 12 (such as lanthanum aluminate) and is then patterned into a transmission line. A piezoelectric film 16 is then deposited on top of the superconducting film 14, patterned, and metal contacts 18, 20 are added such that the structure looks like that shown in FIG. 1. With the geometry of FIG. 1 an electric potential applied between the two contacts will cause a strain (change in dimension) in the piezoelectric film 16 and, thereby induce a stress (and strain) in the underlying superconducting film, 16. In this way, one is able to change the transition width of the superconducting element 14, as shown in FIG. 2. If the temperature of the device 10 is held at a constant temperature $T_C$, the switch will be superconducting (the 'on' state) when the transition is narrow (no strain) and normal (the 'off' state) when the transition is wide (induced strain). The switch 10 is controlled by the voltage applied across the piezoelectric element 16.

There are several combinations of superconducting/piezoelectric materials capable of providing the switching action described above. The superconductor 14 can be either YBCO or thallium-barium-calcium-copper-oxide or bismuth-strontium-calcium-copper-oxide or, in principal, any superconductor that shows a strain-dependent transition width. The piezoelectric element 16 need only be able to couple mechanically to the superconductor 14. One way to satisfy this requirement is to grow, or deposit, the piezoelectric material 16 directly on top of the superconductor 14. It has already been demonstrated in the literature that one can grow thin films of lead-zirconate-titanate (which is actually a ferroelectric, a sub-category of piezoelectrics) on top of YBCO. In the literature, such a structure is used as a polarized capacitor for a nonvolatile memory element. Barium-strontium-titanate is another ferroelectric material that has been successfully deposited onto YBCO. For the switch 10 described here, one could use the same structure, but would polarize the ferroelectric parallel to the plane of the superconductor 14 (instead of perpendicular to the surface, as is done for the memory element). Piezoelectric materials such as quartz may also work if they can be mechanically coupled to the superconductor 14.

The advantages of device 10 (and 50, 100, 150) are indicated hereafter.

- A. Superconducting switches of the prior art depend on either magnetic fields or heat to force a section of superconductor into the normal state. Device 10 does not require the generation of either a magnetic field or an increase in temperature to switch a superconducting wire or transmission line.
- B. Switch 10 is inherently fast unlike prior art thermal switches which take time to heat up, and prior art magnetic switches which often have a fairly high inductance due to the coil required to generate a sufficiently strong magnetic field.
- C. Both thermal and magnetic prior art switches require considerable current whereas piezoelectric switch 10 draws nearly zero current, instead relying upon the applied voltage, resulting in a low-power usage switch.
- D. Device 10 provides relatively fast switching action, while using relatively low power.
- E. Device 10 relies on the change in resistivity between the normal state and the superconducting state to provide the switching action, and relies on inducing strain in the superconductor 14 to make the change in resistivity.

While the invention has been described in its preferred embodiment, it is to be understood that the words which have been used are words of description rather than limitation and that changes may be made within the purview of the appended claims without departing from the true scope and spirit of the invention in its broader aspects.

There are additional alternative embodiments that would operate like device 10. First, instead of placing the contacts at either end of the piezoelectric element, one could place one contact on top of the piezoelectric film and then use the superconducting line as the other contact. Although the electric field is not parallel to the plane of the film, one can induce a strain parallel to the plane of the film given the appropriate piezoelectric material and proper crystal orientation. Another possible embodiment is a superconducting wire coated with a piezoelectric material.

What is claimed is:

1. A piezoelectrically controlled superconducting switch comprising:

a substrate;

a superconductor which is bonded to the substrate; and a piezoelectric subassembly for straining a portion of the superconductor between a normal unstrained condition and an induced strained condition;

said piezoelectric subassembly having a load-applying means for causing strain in the superconductor portion, wherein the load applying means includes a piezoelectric transducer for applying a bending moment to the superconductor and the substrate, and including a first support arm and a second support arm spaced apart and extending from a base plate for holding the substrate at opposite edges thereof and for positioning the piezoelectric transducer.

2. The switch of claim 1, wherein the load applying means is a transverse piezoelectric film which is disposed transverse to superconductor portion and which is bonded thereto.

3. The switch of claim 1, wherein the load applying means is a longitudinal piezoelectric film which is disposed parallel to the superconductor portion and which is bonded thereto.

4. The switch of claim 1, wherein the piezoelectric subassembly has a bias voltage unit which has a first lead and a second lead for energizing the load applying means, and wherein the load applying means has a first metal contact and a second metal contact each connecting to one of the leads.

5. The switch of claim 1, wherein the substrate is made of a piezoelectric material and has opposite sides for connection to opposite leads of a bias voltage unit.

* * * * *